United States Patent
Emer et al.

(10) Patent No.: US 8,134,716 B2
(45) Date of Patent: Mar. 13, 2012

(54) METHODS AND APPARATUS FOR MEASURING WAVEFRONTS AND FOR DETERMINING SCATTERED LIGHT, AND RELATED DEVICES AND MANUFACTURING METHODS

(75) Inventors: Wolfgang Emer, Aalen (DE); Helmut Haidner, Aalen (DE); Ulrich Wegmann, Koenigsbronn (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 945 days.

(21) Appl. No.: 11/908,911

(22) PCT Filed: Mar. 17, 2006

(86) PCT No.: PCT/EP2006/002494
§ 371 (c)(1),
(2), (4) Date: Jun. 9, 2008

(87) PCT Pub. No.: WO2006/097330
PCT Pub. Date: Sep. 21, 2006

(65) Prior Publication Data
US 2008/0231840 A1    Sep. 25, 2008

Related U.S. Application Data

(60) Provisional application No. 60/662,348, filed on Mar. 17, 2005.

(51) Int. Cl.
*G01B 9/02* (2006.01)
(52) U.S. Cl. ........................... 356/521; 356/520
(58) Field of Classification Search .............. 356/515, 356/520, 521; 250/237 G
See application file for complete search history.

(56) References Cited

U.S. PATENT DOCUMENTS

| 4,518,854 A | 5/1985 | Hutchin et al. |
| 2005/0007602 A1 | 1/2005 | Haidner et al. |

FOREIGN PATENT DOCUMENTS

| DE | 102 58 142 A1 * | 6/2004 |
| DE | 10 2004 010825 A1 | 4/2005 |

OTHER PUBLICATIONS

English Machine Translation of DE 10258142.*

(Continued)

*Primary Examiner* — Patrick J Connolly
(74) *Attorney, Agent, or Firm* — Sughrue Mion, PLLC

(57) ABSTRACT

A method and apparatus for spatially resolved wavefront measurement on a test specimen, a method and apparatus for spatially resolved scattered light determination, a diffraction structure support and a coherent structure support therefor, and also an objective or other radiation exposure device manufactured using such a method, and an associated manufacturing method. An embodiment involves carrying out, for the wavefront measurement, a first shearing measuring operation, which includes a plurality of individual measurements with at least two first shearing directions and spatially resolved detection of shearing interferograms generated, and an analogous second shearing measuring operation with at least one second shearing direction, the at least one second shearing direction being non-parallel to at least one first shearing direction. From the shearing interferograms detected, it is possible e.g. to determine a wavefront spatial frequency spectrum and/or a point response of the test specimen and to carry out a spatially resolved scattered light determination with a point spread function. The embodiment may be used, e.g., for spatially resolved scattered light determination of projection objectives for microlithography.

26 Claims, 4 Drawing Sheets

OTHER PUBLICATIONS

Figure 1:
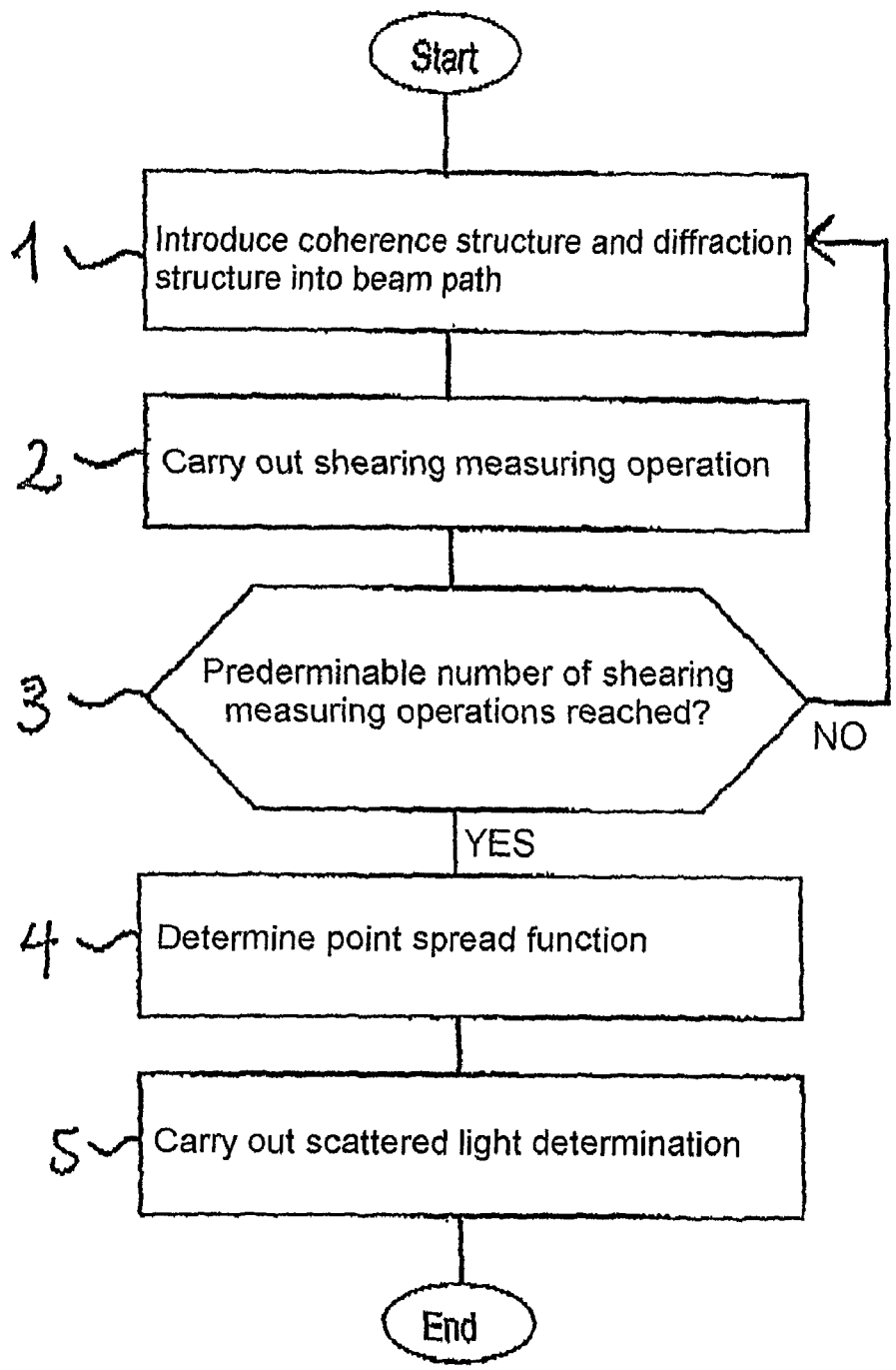

Elster, C. and I. Weingaertner: "Solution to the shearing problem," Applied Optics 38 (1999), pp. 5024-503.

Malacara, Daniel, "Optical Shop Testing," $2^{nd}$ ed. Wiley 1992, pp. ix-xiv.

Goodman, J.W., "Statistical Optics," Wiley 1985, Chapter 8.

Kirk, J. P.: "Scattered light in photolithographic lenses," SPIE vol. 2197 (1994), pp. 566-572.

Church, Eugene: "Fractal surface finish," Applied Optics, vol. 27, No. 8 (1988), pp. 1518-1526.

* cited by examiner

METHODS AND APPARATUS FOR MEASURING WAVEFRONTS AND FOR DETERMINING SCATTERED LIGHT, AND RELATED DEVICES AND MANUFACTURING METHODS

This is a National Stage Application of International Application No. PCT/EP2006/002494, filed Mar. 17, 2006, which claims the benefit of Provisional Application No. 60/662,348, filed Mar. 17, 2005.

This application claims priority of U.S. patent application No. 60/662,348 which is herewith incorporated herein in its entirety by reference.

The invention relates to a method and apparatus for spatially resolved wavefront measurement on a test specimen, a method and apparatus for spatially resolved scattered light determination, a diffraction structure support and a coherent structure support therefor, and also to an objective or other radiation exposure device manufactured using such a method, and an associated manufacturing method. In the present case the term "spatially resolved wavefront measurement" generally encompasses the determination of a wavefront using an arbitrary in general interferometry technique, such as a lateral shearing interferometry technique, and the spectral decomposition of a measured wavefront according to its spatial frequencies.

Methods for wavefront measurement and associated devices are variously known. Shearing interferometric methods are disclosed e.g. in the published patent application US 2002/001088. In one type of these methods, a periodic diffraction structure is displaced stepwise laterally relative to the test specimen or to a coherence-determining mask structure. In this case, the period length of the diffraction structure defines a shearing length and the periodicity direction of the diffraction structure defines a shearing direction. One important application is the high-precision measurement of projection objectives in microlithography for semiconductor wafer patterning with regard to aberrations. In further applications, the wave aberrations of arbitrary other optical systems can also be determined. The detected wavefront may also be a measure of various other parameters which can be determined by corresponding spatially resolved wavefront measurement by means of lateral shearing interferometry, such as the homogeneity of a test specimen measured in transmission or the surface of a test specimen measured in reflection. The development coefficients of a spectral decomposition of the measured wavefront according to its spatial frequencies may then serve e.g. as a measure of relevant spatial frequencies of an examined surface or of the light scattered at different angles in an imaging system or other optical system.

Such methods, particularly if they are based on two-beam interferometry, inherently do not permit a determination of the wavefront at spatial frequencies which correspond to the shearing length or an integral multiple thereof. For wavefront measurement in these "forbidden" spatial frequencies it is known to carry out a plurality of measurements with different period lengths and thus different shearing lengths, as set forth in the journal paper "Solution to the Shearing Problem", Applied Optics 38, pp. 5024-5031 (1999) by C. Elster and I. Weingärtner. It is also known to interpolate over the "forbidden" spatial frequencies in the spatial frequency domain.

An also spatially resolved scattered light determination can be carried out using the measurement data obtained during a wavefront measurement. For this purpose, the point response, also called point spread function in the following, and the phase variance of the test specimen are determined from the measurement data and from these the scattered light portion is calculated as a function of the scattered light distance, as explained in more detail e.g. in the textbook "Statistical Optics" by J. W. Goodman, Wiley (1985), chapter 8. Further conventional methods for determining scattered light are found in the relevant literature, see e.g. the journal paper by J. P. Kirk, "Scattered Light in Photolithographic Lenses", SPIE vol. 2197 (1994), pp. 566-572, and the journal paper by Eugene L. Church, "Fractal Surface Finish", Applied Optics, vol. 27, No. 8 (1988), pp. 1518-1526.

The scattered light constitutes a degrading factor for the imaging quality of optical imaging systems, such as projection objectives for microlithography. Medium-range (approximately 1 µm to 100 µm) and short-range (less than about 1 µm) scattered light can be attributed to transmission and phase variations as light passes through projection objectives. Such variations may result for example from surface roughnesses and surface contaminations of lenses or structures in the lens material.

The "forbidden" spatial frequencies often lie in the medium- or short-range scattered light range and can therefore make it more difficult to determine scattered light over a continuous frequency range. This issue is even more important when considering wavefront measurements of higher Zernike coefficients or for frequencies above a given threshold. Such measurements become increasingly important e.g. for determining aberrations of objectives and other radiation exposure devices used in high resolution microlithography exposure systems operating in the very short DUV or EUV wavelength range.

The technical problem on which the invention is based is to provide a method and apparatus by means of which a wavefront measurement and/or scattered light determination can be carried out with relatively little outlay in particular also for "forbidden" spatial frequencies defined by integral multiples of the shearing length. Another object of the invention is to provide an associated diffraction structure support and an associated coherence structure support and also an objective or other radiation exposure device manufactured using the method, and an associated manufacturing method.

The invention solves this problem by providing a method for wavefront measurement comprising the features of claim 1 or 17, a corresponding apparatus comprising the features of claim 18, an exposure system comprising the features of claim 19, a method for spatially resolved scattered light determination comprising the features of claim 5, a diffraction structure support comprising the features of claim 20, a coherence structure support comprising the features of claim 21, a manufacturing method comprising the features of claim 22, and an objective comprising the features of claim 23.

In one aspect the invention provides a method for spatially resolved wavefront measurement on a test specimen by means of shearing interferometry or some other interferometric technique comprising carrying out a first measuring operation, which comprises a plurality of individual measurements with at least two first directions and spatially resolved detection of interferograms generated, and carrying out a second measuring operation, which comprises one or a plurality of individual measurements with at least one second direction and spatially resolved detection of interferograms generated, at least one second direction being non-parallel to at least one first shearing direction. The interferograms detected are evaluated so as to obtain an item of wavefront information at least for predeterminable spatial frequencies.

When using shearing interferometry, each of the two shearing measuring operations by itself permits a two-dimensional wavefront reconstruction if e.g. individual measurements are carried out along in each case at least two non-parallel shearing directions. However, "forbidden" spatial frequencies corresponding to the shearing length occur during each shearing measuring operation. By altering the shearing direction in at least one subsequent shearing measuring operation, the "forbidden" spatial frequencies can be reduced, and if appropriate completely eliminated, in a relatively simple manner without mandatory use of different shearing lengths. In an advantageous refinement, a complete spatial frequency spectrum of the wavefront profile can be obtained in this way.

In a refinement of the method e.g. a type of shearing interferometry that works with diffraction structures is used for carrying out the shearing measuring operations. In this case, the individual measurements of the first shearing measuring operation are effected by a shearing displacement of one or a plurality of first diffraction structures positioned in the beam path along at least two first periodicity directions thereof which define the corresponding first shearing directions. The individual measurements of the second shearing measuring operation are analogously effected on the basis of a shearing displacement of one or a plurality of second diffraction structures positioned in the beam path along at least two second periodicity directions thereof which define the associated second shearing directions.

In a refinement of the method a point response of the test specimen is determined from the interferograms detected and a spatially resolved scattered light determination is carried out by means of the point response. On account of the elimination of "forbidden" spatial frequencies during the spatially resolved wavefront measurement, it is possible to determine scattered light for these spatial frequencies as well.

In a development of the method a common diffraction structure in rotated orientations is used for the first diffraction structure and the second diffraction structure. Carrying out the method using a common diffraction structure which is altered in terms of orientation during different measuring operations is cost-effective and easy to realize.

A method according to the invention for spatially resolved scattered light measurement on a test specimen comprises carrying out a measuring operation comprising a plurality of individual measurements with a displacement of a diffraction structure positioned in the beam path along at least four periodicity directions of the diffraction structure which define at least four associated shearing directions, and spatially resolved detection of interferograms generated, determining the point response of the test specimen from the interferograms detected, and spatially resolved scattered light determination from the point response determined. By means of a measuring operation along at least four non-parallel directions, it is possible to eliminate "forbidden" spatial frequencies in the wavefront measurement, so that it is possible to achieve a spatially resolved scattered light determination with all spatial frequencies without, when using shearing interferometry, different shearing lengths necessarily being required for this purpose.

A development of the method involves carrying out two individual measurements of the measuring operation or operations for two mutually perpendicular first directions and two further individual measurements of the measuring operation or operations for two mutually perpendicular second directions, the first directions being rotated through a non-orthogonal angle with respect to the second directions relative to a test specimen orientation. The first directions generate associated first "forbidden" spatial frequencies and the second directions generate associated second "forbidden" spatial frequencies. By rotation through a non-orthogonal angle and by performing one or a plurality of further individual measurements with rotated orientation, it is possible to eliminate all "forbidden" spatial frequencies, that is to say that all the spatial frequencies of the detected wavefront can be determined.

In a refinement of the method, the same diffraction structure is used for carrying out first individual measurements of the shearing measuring operation or operations as is used for carrying out second individual measurements of the measuring operation or operations in a rotated orientation relative to the test specimen, for which purpose the test specimen and/or the diffraction structure is correspondingly rotated. The use of the same diffraction structure for a plurality of individual measurements enables the measuring outlay to be reduced.

In a development of the method at least two diffraction structures with non-parallel periodicity directions are arranged on a common diffraction structure support in partial regions of the diffraction structure support that are spaced apart from one another, and, between different individual measurements of the measuring operation or operations, the at least two diffraction structures are mutually interchanged by laterally displacing the diffraction structure support. In this refinement of the method, a rotated diffraction structure can in each case be brought into the beam path by simple lateral displacement of the diffraction structure support.

In a refinement of the method at least one diffraction structure has at least two different period lengths in at least one periodicity direction. By using a plurality of different period lengths, "forbidden" spatial frequencies can also be eliminated by the accompanying different shearing lengths.

In a development of the method in order to carry out at least one individual measurement of the measuring operation or operations, a coherence structure with at least one periodicity direction and at least one associated period length is positioned in the beam path upstream of the respective diffraction structure, the periodicity direction of the coherence structure corresponding to a corresponding measurement direction and the period length of the coherence structure corresponding to a corresponding diffraction structure period length. The wavefront measurement is facilitated by the use of coherence structures corresponding to the diffraction structures. For the relative displacement of the diffraction structure, the latter and/or the coherence structure can be actively moved.

In a refinement of the method the same coherence structure is used for carrying out first individual measurements of the measuring operation or operations as is used for carrying out second individual measurements of the measuring operation or operations in a rotated orientation relative to the test specimen, for which purpose the test specimen and/or the coherence structure is correspondingly rotated. A rotation of the coherence structure can be carried out without altering the position of the diffraction structure, but it is alternatively also possible to rotate both structures and/or the test specimen.

In a development of the method at least two coherence structures with non-parallel periodicity directions are arranged on a common coherence structure support in partial regions of the coherence structure support that are spaced apart from one another, and, between different individual measurements of the measuring operation or operations, the at least two coherence structures are mutually interchanged by laterally displacing the coherence structure support. This procedure is particularly advantageous if a diffraction structure support corresponding to the coherence structure support is used.

In a development of the method at least one coherence structure has at least two different period lengths in at least one periodicity direction. Such a coherence structure can advantageously be used with a corresponding diffraction structure.

A refinement of the method is carried out on a projection objective of a microlithography projection exposure apparatus as test specimen. Through a characterization of the imaging properties of such projection objectives by means of wavefront measurement and/or scattered light determination, effects which disturb the imaging and which are brought about e.g. by contaminations on lens surfaces can be detected and, if appropriate, suitable counter measures can be implemented.

In a development of the method the evaluation of the measurement data obtained by the measuring operations comprises a wavefront reconstruction on the basis of in each case two of three or more wavefront gradients and a combination of wavefronts obtained in this way, which realizes a partial redundancy, or a wavefront reconstruction simultaneously on the basis of all the wavefront gradients detected. These evaluation methods can be realized well, on the one hand, and, on the other hand, enable a good accuracy of the wavefront determination for practically all desired spatial frequencies.

In a particular advantageous embodiment of the invention the measurement technique used is a shearing interferometry technique.

In a further aspect the invention provides a method for wavefront measurement adapted to determine relatively high Zernike coefficients, such as at least one Zernike coefficient higher than 36, and preferably higher than 64, or the method is adapted for spatially resolved wavefront measurements for spatial frequencies up to or above a predetermined threshold.

In a further aspect the invention provides for apparatuses suited to carry out the inventive wavefront measurement methods. The invention further provides for an exposure system, such as a microlithography exposure system, which is equipped with an apparatus for conducting the wavefront measurement method of the present invention.

A diffraction structure support according to the invention comprises a plurality of diffraction structures which are arranged in partial regions of the diffraction structure support that are spaced apart from one another, and each of which has at least one period length and at least one periodicity direction, wherein the periodicity directions of at least two diffraction structures are non-parallel to one another. The diffraction structure support can be used particularly advantageously in the abovementioned methods.

A coherence structure support according to the invention comprises a plurality of coherence structures which are arranged in partial regions of the coherence structure support that are spaced apart from one another, and each of which has at least one period length and at least one periodicity direction, wherein the periodicity directions of at least two coherence structures are non-parallel to one another. The coherence structure support can also be used advantageously in the abovementioned methods.

An objective or other optical component according to the invention, e.g. a microlithography projection objective, may be manufactured by a method according to the invention using the wavefront measurement and/or scattered light measurement method according to the invention.

Figure 2:
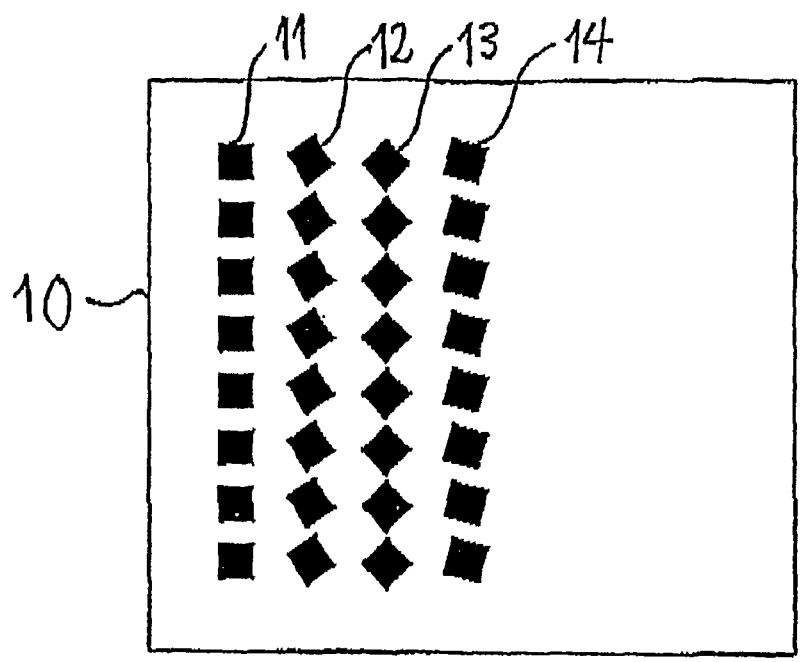
Figure 3:
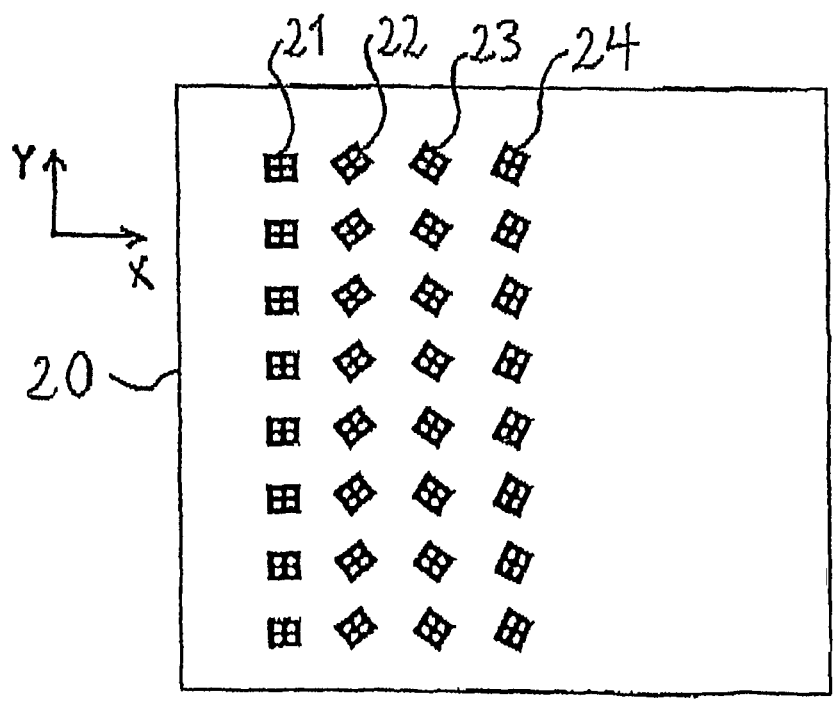
Figure 4:
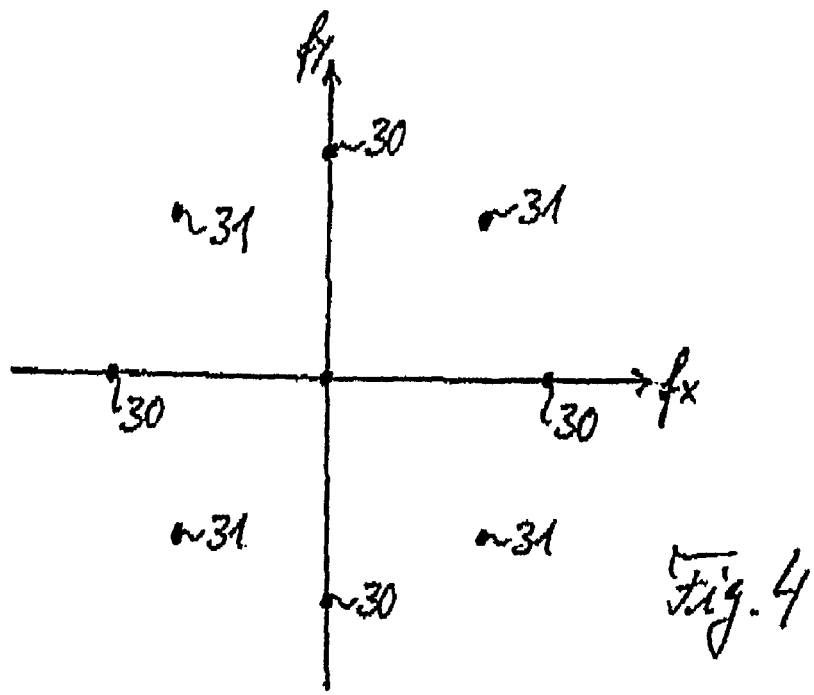
Figure 5:
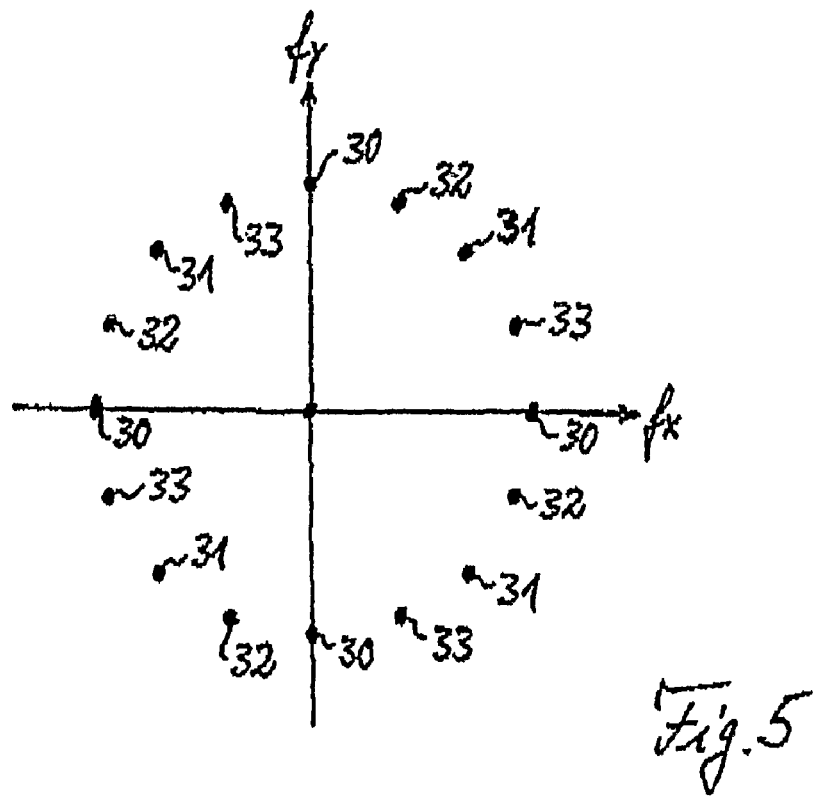
Figure 6:
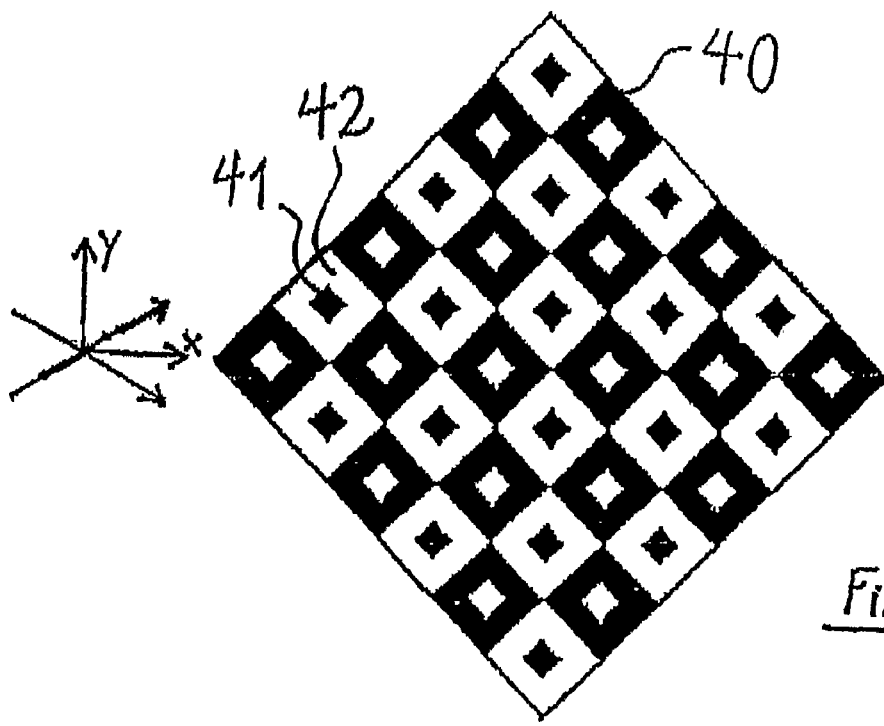
Figure 7:
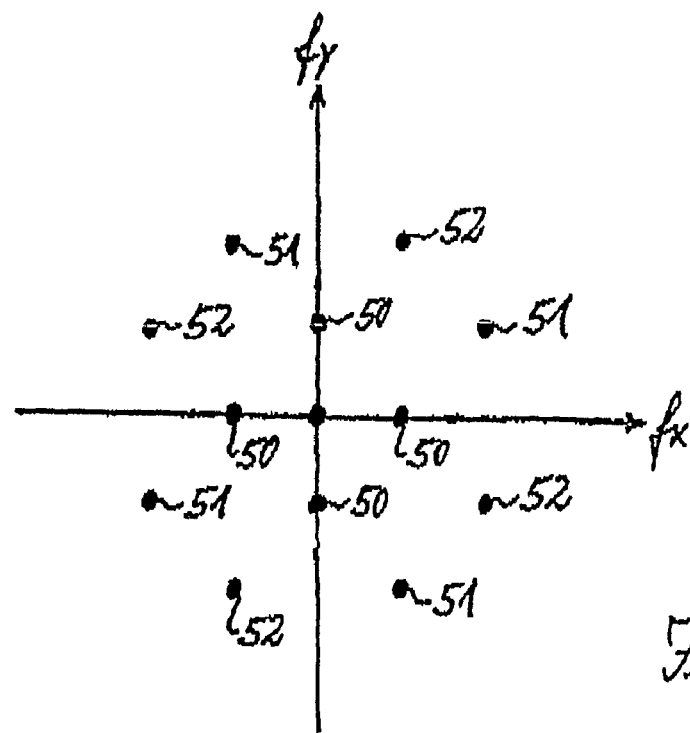

Advantageous exemplary embodiments of the invention are illustrated in the drawings and are described below. In the figures:

FIG. 1 shows a flow diagram of a method according to the invention for scattered light determination, FIG. 2 shows a plan view of a coherence structure support with eight regions arranged one under another and each having four partial regions spaced apart from one another, which comprise four coherence structures rotated at an angle of 22.5° relative to one another, FIG. 3 shows a plan view of a diffraction structure support with diffraction structures corresponding to the coherence structures of FIG. 4, FIG. 4 shows a spatial frequency diagram in which "forbidden" spatial frequencies occurring during two shearing measuring operations with the structures shown in FIGS. 2 and 3 are specified, FIG. 5 shows a spatial frequency diagram in which "forbidden" spatial frequencies occurring during four shearing measuring operations with the structures shown in FIGS. 2 and 3 are specified, FIG. 6 shows a plan view of a diffraction structure with a plurality of non-parallel periodicity directions and two different period lengths in a periodicity direction, and FIG. 7 shows a spatial frequency diagram with "forbidden" spatial frequencies generated during a shearing measuring operation with the diffraction structure of FIG. 6.

The flow diagram of FIG. 1 shows an exemplary embodiment of a method for wavefront measurement and scattered light measurement on an optical imaging system as test specimen, e.g. a microlithography projection objective of a wafer stepper or wafer scanner. In a first method step (step 1), a coherence structure support 10 shown in FIG. 2 is introduced on the object side, preferably in an object plane, and a diffraction structure support 20 shown in FIG. 3 is introduced on the image side, preferably in an image plane, from the projection objective, so that a first coherence structure 11 of four coherence structures 11, 12, 13, 14 which are arranged next to one another in partial regions of the coherence structure support 10 that are spaced apart from one another along an x direction of a system of xy coordinates and a first diffraction structure 21 of four diffraction structures 21, 22, 23, 24 which are arranged next to one another in partial regions of the diffraction structure support 20 that are spaced apart from one another along the x direction lie in the beam path of the projection objective. Identical coherence and diffraction structures are respectively arranged in a manner repeated seven-fold in a manner offset in the y direction with respect to the four coherence structures 10, 11, 12, 13 and the four diffraction structures 21, 22, 23, 24. This repeated arrangement is useful e.g. for applications in situ in a wafer scanner that is moved only in a lateral direction.

The diffraction structures 21, 22, 23, 24 are formed e.g. as customary checkered gratings. These have two mutually perpendicular periodicity directions with an identical period length. The coherence structures 11 to 14 correspond to the diffraction structures 21 to 24, that is to say that they match the latter down to the imaging skill of the projection objective and serve, as is known, for coherence shaping.

In a subsequent step 2 of the method, a first shearing measuring operation is carried out. For this purpose, during a first individual measuring operation, the diffraction structure 21 is displaced laterally relative to the projection objective and to the coherence structure 11, which is illuminated by an upstream illumination system, along the first periodicity direction, which e.g. corresponds to the x direction of the system of xy coordinates and defines a first shearing direction. During a subsequent second individual measuring operation, the diffraction structure is displaced laterally along the second periodicity direction, which defines a second shearing direction corresponding e.g. to the y direction of the system of xy coordinates. The wavefront which is emitted by the coherence structure 11 and passes through the projection objective is diffracted at the diffraction structure 21 into different orders of diffraction, e.g. into a 0th and 1st order of diffraction, the interference pattern of which is detected on a downstream spatially resolving detector. As an alternative to an active shearing displacement of the diffraction structure 21, it is also possible, of course, for the coherence structure 11 and/or the projection objective to be actively laterally displaced.

The wavefront and thus the aberration behavior of the projection objective can be determined in spatially resolved fashion from the two individual measuring operations along the two mutually perpendicular shearing directions. Inherently excluded from the determination in this case are "forbidden" spatial frequencies corresponding to the shearing length defined by the period length of the diffraction structure 21 and of the coherence structure 11 in the two x and y periodicity directions. These "forbidden" spatial frequencies are represented for the ±1st orders in FIG. 4 as points 30 in the spatial frequency domain, that is to say in a system of $f_x/f_y$ coordinates with the spatial frequency directions $f_x$ and $f_y$.

The wavefront determination for the "forbidden" spatial frequencies 30 as well is now made possible by virtue of carrying out one or a plurality of further shearing measuring operations. Therefore, in a step 3 of the method, firstly a check is made to ascertain whether a predeterminable number of shearing measuring operations which permit a scattered light determination with sufficient accuracy or a wavefront determination for all desired spatial frequencies has been reached. If this is not the case, further shearing measuring operations are carried out by repeating steps 1 and 2 of the method. In the present case, a second measuring operation is carried out by laterally displacing the coherence structure support 10 and the diffraction structure support 20, so that a second diffraction structure 23, which is rotated through 45° with respect to the diffraction structure 21 used during the previous shearing measuring operation, and also a corresponding second coherence structure 13 are introduced into the beam path. The "forbidden" spatial frequencies 31 which occur during a subsequent second shearing measuring operation carried out analogously to the first operation and are shown in FIG. 4 accordingly lie in directions rotated through 45° relative to those of the first shearing measuring operation. In addition to the spatial frequencies depicted in FIG. 4, all those frequencies which result from an integral linear combination of the spatial frequency vectors which point from the origin to the "forbidden" points 30, 31 in FIG. 4 are also "forbidden". The "forbidden" spatial frequencies can be eliminated by combining the two measurements. In other words, at least two gradients of the wavefront detected by lateral shearing interferometry can then be found for each spatial frequency, from which gradients the corresponding spatial frequency of the wavefront can be reconstructed.

It may be desired to carry out further shearing measuring operations in order to increase the evaluation accuracy and/or to provide a partial redundancy. For this purpose, e.g. two further shearing measuring operations are carried out with a third and fourth diffraction structure 12, 14 and a third and fourth coherence structure 22, 24 of the structure supports 10, 20 in FIGS. 2 and 3, these structures being rotated through ±22.5° relative to the diffraction structures 21, 23 and coherence structures 11, 13 used during the two first shearing measuring operations. The associated "forbidden" third and fourth spatial frequencies 33, 32 are shown together with the "forbidden" spatial frequencies 30, 31—which are separated from these—of the two first shearing measuring operations for the ±1st order in FIG. 5. It is evident that the combination of the four shearing measuring operations contains no "forbidden" spatial frequencies, that is to say that the intersection set of all "forbidden" spatial frequencies 30, 31, 32, 33 of the individual measurements is empty.

In a subsequent step 4 of the method, the shearing interferograms detected during the wavefront measurement are used to determine a point spread function (PSF) and a phase variance $\sigma_\phi^2$ as mean square error of the phase error in a conventional manner. For a precise description of the calculations required for this purpose, reference may be made to the relevant literature.

The point spread function and the phase variance are linked with the spatially resolved scattered light component to be determined, which corresponds to the power spectral density (PSD), to a good approximation in accordance with the following equation:

$$PSF(r)=(1-\sigma_\phi^2)\delta(r)+PSD_\phi(r) \quad (a)$$

with the spatial variables r and the phase $\phi$. The first addend $(1-\sigma_\phi^2)\delta(r)$ is equivalent to the beam ratio of the projection objective.

In a final method step 5, the spatially resolved scattered light component PSD(r) is determined in accordance with equation (a) above and can be used for characterizing the imaging properties of the projection objective.

As an alternative to the procedure described above, it is possible to carry out a scattered light determination in accordance with the method of FIG. 1 also with a single shearing measuring operation, e.g. using a multifrequency diffraction structure 40 shown in FIG. 6. This diffraction structure 40 has a periodic sequence of interleaved small and large squares in a checkered arrangement. There is a respective periodicity direction along the x direction and the y direction of a system of xy coordinates having an identical period length. Besides these two periodicity directions, the diffraction structure 40 also has two further, oblique periodicity directions having an identical period length, which, however, is smaller than that of the x and y periodicity directions, which are highlighted by arrows in the system of xy coordinates. For further details of such a multifrequency diffraction structure, reference shall be made to the applicant's published patent application DE 102 58 142 A1, the content of which is hereby fully incorporated by reference in this application.

When carrying out two individual measurements having the larger period length along the x and y directions, there are corresponding "forbidden" spatial frequencies 50 in the spatial frequency domain, as illustrated in FIG. 7. Corresponding "forbidden" spatial frequencies 51 arise when carrying out two individual measurements in one oblique direction. Since they are associated with a larger period length, in the spatial frequency domain they lie further away from the origin than the "forbidden" spatial frequencies 50 on the $f_x$ and $f_y$ axes.

When carrying out two further individual measurements along the other oblique periodicity direction, further "forbidden" spatial frequencies 52 lying in a rotated direction with respect to the "forbidden" spatial frequencies 50, 51 arise at the same distance from the origin as the forbidden spatial frequencies 51. Overall, the intersection set of the "forbidden" spatial frequencies 50, 51, 52 is empty, so that it is possible to carry out a scattered light determination in accordance with steps 4 and 5 of the method without "forbidden" spatial frequencies. In addition to the four individual measurements shown here along non-parallel periodicity directions, the diffraction structure 40 also permits two further individual measurements of this type, so that a wavefront measurement and/or scattered light determination is possible with the diffraction structure 40 along a total of six non-parallel periodicity directions without the diffraction structure 40 having to be rotated. Such rotation is of course likewise possible as required if shearing measurements are also intended to be carried out for correspondingly different shearing directions.

In some wavefront measurement methods, in addition to a forbidden spatial frequency corresponding to the period length, further, higher-order forbidden spatial frequencies which correspond to multiples of the period length, in particular to the doubled period length of the diffraction structure, may also play a part. These higher-order "forbidden" spatial frequencies can also be eliminated by the method according to the invention.

As an alternative to the procedures described above, in order to produce shearing interferograms along a plurality of periodicity directions, a diffraction structure and/or a coherence structure can be rotated through a predeterminable angle relative to the projection objective. In this case, the diffraction structures and/or coherence structures may each have one or a plurality of periodicity directions and one or a plurality of period lengths along each periodicity direction. For this purpose, the diffraction structures and/or coherence structures may be fitted on a rotatable diffraction structure support and/or a rotatable coherence structure support.

Whereas primarily an application for determining scattered light has been discussed above, the method according to the invention is also suitable for any other applications in which wavefront gradients are measured by means of lateral shearing interferometry and the associated wavefront is reconstructed therefrom and, in particular, the as far as possible complete spatial frequency spectrum thereof is determined. In accordance with the lateral shearing interferometry technique, per field point considered, two or more wavefront gradients are determined in mutually non-parallel directions, as result from the difference between two or more wavefront duplicates that are displaced in the respective direction with respect to one another. As explained above, for a given shearing interferometry measurement set up with two shearing distances in two different directions, there are always two non-detectable, that is to say "forbidden", spatial frequencies, that is to say—in the two-dimensional spatial frequency domain—four first-order regions for which the shearing interferometer is "blind". By adding at least one further shearing direction which is non-parallel to one of the two first-mentioned directions, at least two wavefront gradients can then be found for each spatial frequency, from which wavefront gradients it is possible to reconstruct the relevant spatial frequency contribution for the wavefront.

Various possibilities for evaluation after carrying out the measurements in one or a plurality of further shearing directions are thus possible. In one instance, a wavefront can be reconstructed from in each case two wavefront gradients in the manner that is customary per se. In the case of three or more measured wavefront gradients, a plurality of wavefronts can then be determined by means of different combinations, which means a wavefront determination with partial redundancy, but now at least one wavefront containing the relevant spatial frequency is obtained for each spatial frequency. An alternative evaluation method consists in reconstructing a wavefront whilst simultaneously taking account of all the different gradients.

Any desired shearing interferometry technique is suitable for carrying out the method according to the invention, e.g. of the abovementioned type such as is used by the applicant under the designation "operating interferometer"—in this respect, see for example DE 102 58 142 A1 already mentioned, or of the type having Ronchi gratings or a type without gratings, or one of the shearing interferometry techniques described in the textbook D. Malacara, Optical Shop Testing, 2nd edition 1992, J. Wiley & Sons, Inc., to which reference may be made for further details.

By phase shifting, the accuracy can be increased in particular for higher spatial frequencies, but this is optional. In general, the phase shifting can be effected by moving corresponding elements in the measurement set up, e.g. a diffraction grating or other diffracting elements.

While the embodiments explained above are based on shearing interferometry, it should be noted that according to the invention any other wavefront measurement technique can be used which one of ordinary skill in the art knows to be an equivalent means for carrying out the measurements in line with the purpose of the present invention.

The invention further allows in another aspect to determine relatively high Zernike coefficients, in particular Zernike coefficients higher than 36 and preferably higher than 64 by using appropriately designed wavefront measurement methods and apparatuses. Just to give a non-limiting example, by using corresponding methods and apparatuses, any desired Zernike coefficient in any desirable range above 64, e.g. between 64 and 80, or between 80 and 100, could be determined. Equivalently the invention provides for methods and apparatuses to conduct spatially resolved wavefront measurements for comparatively high spatial frequencies up to or above a predetermined, relatively high threshold.

This aspect of the invention becomes increasingly important for measuring aberrations of high-resolution objectives such as used in modern microlithography exposure systems which operate at very small wave length in the DUV and EUV range, especially for objectives having high numerical apertures of about 1.0 or more. For such high-resolution optical components it is very advantageous to achieve aberration measurements at such high Zernike coefficience or spatial frequencies and obviating forbidden spatial frequencies. An exposure system of the invention can be equipped with a corresponding wavefront measurement apparatus for allowing in-situ measurements of such high Zernike coeffiecence or up to a comparatively high spatial frequency threshold or above such frequency threshold.

The method according to the invention may be used for example in the manufacture of objectives, e.g. microlithography projection objectives of a wafer stepper or wafer scanner. In this case, the objective is prefabricated in a manner that is conventional per se, and is then tested in spatially resolved fashion in terms of its optical imaging behavior by wavefront measurement and/or scattered light measurement according to the invention. Depending on the test result, changes may subsequently also be made to the objective, whether to the material of one or a plurality of optical components of the objective itself, or through alignment measures and/or adjustments of objective parameters that can be set, e.g. by means of assigned manipulators of lens elements, etc. The objective manufactured in this way is then correspondingly optimized in terms of its imaging behavior.

The method according to the invention is clearly not restricted to a projection objective as test specimen, but rather can be carried out on arbitrary optical systems and other test specimens in transmission or reflection in which there is a need for wavefront measurement or scattered light determination to the greatest possible extent without "forbidden" spatial frequencies. The wavefront determined is in each case a measure of the sought parameter to be determined, such as the wave aberrations of an optical system, the homogeneity of a test specimen measured in transmission or the surface of a test specimen measured in reflection. Thus, the development coefficients with regard to the spatial frequencies of the wavefront determined according to the invention with their spatial frequency spectrum may describe for example spatial frequencies of the constitution of a surface or the light scattered at different angles in an imaging system.

The invention claimed is:

1. A method for spatially resolved wavefront measurement on a test specimen, comprising:
   a) carrying out a first measuring operation, which includes a plurality of individual measurements with at least two first directions and spatially resolved detection of interferograms generated,
   b) subsequent to the first measuring operation, carrying out a second measuring operation, which includes at least one individual measurement with at least one second direction and spatially resolved detection of interferograms generated, the at least one second direction being non-parallel to at least one of the first directions, and
   c) evaluating the interferograms detected in order to obtain an item of wavefront information at least for predetermined spatial frequencies.

2. The method as claimed in claim 1, wherein the plurality of individual measurements of the first measuring operation comprise a displacement of at least one of first diffraction structures positioned in the beam path along at least two first periodicity directions thereof which define the associated first directions, and the plurality of individual measurements of the second measuring operation comprise a displacement of at least one of second diffraction structures positioned in the beam path along at least two second periodicity directions thereof which define the associated second directions.

3. The method as claimed in claim 1, further comprising determining a point response of the test specimen from the interferograms detected, and carrying out a spatially resolved scattered light determination by means of the point response.

4. The method as claimed in claim 2, wherein a common diffraction structure in rotated orientations is used for the first diffraction structure and the second diffraction structure.

5. A method for wavefront measurement on a test specimen, as claimed in claim 1, wherein at least one Zernike coefficient higher than 36 is determined, or measurements for corresponding spatial frequencies at least up to a predetermined threshold are conducted for the test specimen.

6. An apparatus for spatially resolved wavefront measurement on a test specimen, adapted to carry out the method of claim 1.

7. An exposure system, equipped with an apparatus for spatially resolved wavefront measurement according to claim 6.

8. A method for manufacturing an optical component, comprising:
   prefabricating the objective,
   testing the prefabricated objective by spatially resolved wavefront measurement by the method as claimed in claim 1, and
   finishing the production of the objective in a manner dependent on the test result.

9. An optical component, manufactured by the method as claimed in claim 8.

10. A method for spatially resolved scattered light measurement on a test specimen, comprising:
    a) carrying out a measuring operation including a plurality of individual measurements with a displacement of a diffraction structure positioned in the beam path along at least four periodicity directions of the diffraction structure which define at least four associated directions, and spatially resolved detection of interferograms generated,
    b) determining the point response of the test specimen from the interferograms detected, and
    c) performing a spatially resolved scattered light determination from the point response determined.

11. The method as claimed in claim 10, comprising two individual measurements of the measuring operation for two mutually perpendicular first directions and two further individual measurements of the measuring operation for two mutually perpendicular second directions, the first directions being rotated through a non-orthogonal angle with respect to the second directions relative to a test specimen orientation.

12. The method as claimed in claim 10, wherein the same diffraction structure is used for carrying out first individual measurements of the measuring operation as is used for carrying out second individual measurements of the measuring operation in a rotated orientation relative to the test specimen, at least one of the test specimen and the diffraction structure being correspondingly rotated.

13. The method as claimed in claim 10, wherein at least two diffraction structures with non-parallel periodicity directions are arranged on a common diffraction structure support in partial regions of the diffraction structure support that are spaced apart from one another, and, between different individual measurements of the measuring operation, the at least two diffraction structures are mutually interchanged by laterally displacing the diffraction structure support.

14. The method as claimed in claim 10, wherein at least one diffraction structure has at least two different period lengths in at least one periodicity direction.

15. The method as claimed in claim 10, wherein, in order to carry out at least one individual measurement of the measuring operation, a coherence structure with at least one periodicity direction and at least one associated period length is positioned in the beam path upstream of the respective diffraction structure, the periodicity direction of the coherence structure corresponding to a corresponding diffraction structure periodicity direction and the period length of the coherence structure corresponding to a corresponding diffraction structure period length.

16. The method as claimed in claim 15, wherein the same coherence structure is used for carrying out first individual measurements of the measuring operation as is used for carrying out second individual measurements of the measuring operation in a rotated orientation relative to the test specimen, at least one of the test specimen and the coherence structure being correspondingly rotated.

17. The method as claimed in claim 15, further comprising arranging at least two coherence structures with non-parallel periodicity directions on a common coherence structure support in partial regions of the coherence structure support that are spaced apart from one another, and, between different individual measurements of the measuring operation, mutually interchanging the at least two coherence structures by laterally displacing the coherence structure support.

18. The method as claimed in claim 15, wherein at least one coherence structure has at least two different period lengths in at least one periodicity direction.

19. The method as claimed in claim 10, carried out on at least one of a projection objective and another component of a microlithography projection exposure apparatus as test specimen.

20. The method as claimed in claim 10, wherein at least three wavefront gradients are determined from the individual measurements carried out, and a respective wavefront is reconstructed from respectively two wavefront gradients, or a common wavefront is simultaneously reconstructed from all the wavefront gradients.

21. The method as claimed in claim 10, wherein the wavefront measurement is made by shearing interferometry.

22. An apparatus for spatially resolved scattered light measurement on a test specimen, adapted to carry out the method of claim 10.

23. A method for manufacturing an optical component, comprising:
prefabricating the objective,
testing the prefabricated objective by spatially resolved scattered light measurement by the method as claimed in claim 10, and
finishing the production of the objective in a manner dependent on the test result.

24. An optical component, manufactured by the method as claimed in claim 23.

25. A diffraction structure support having a plurality of diffraction structures which are arranged in partial regions of the diffraction structure support that are spaced apart by a predetermined, non-zero distance from one another, and each of which has at least one period length and at least one periodicity direction, wherein the periodicity directions of at least two of the diffraction structures are non-parallel to one another.

26. A coherence structure support having a plurality of coherence structures which are arranged in partial regions of the coherence structure support that are spaced apart by a predetermined, non-zero distance from one another, and each of which has at least one period length and at least one periodicity direction, wherein the periodicity directions of at least two of the coherence structures are non-parallel to one another.

* * * * *

UNITED STATES PATENT AND TRADEMARK OFFICE
CERTIFICATE OF CORRECTION

| | |
|---|---|
| PATENT NO. | : 8,134,716 B2 |
| APPLICATION NO. | : 11/908911 |
| DATED | : March 13, 2012 |
| INVENTOR(S) | : Wolfgang Emer, Helmut Haidner and Ulrich Wegmann |

It is certified that error appears in the above-identified patent and that said Letters Patent is hereby corrected as shown below:

Sheet 1 of drawings: Fig. 1: delete "Prederminable" and insert -- Predeterminable --

Column 1, Line 59: delete "1." and insert -- I. --

Signed and Sealed this

Thirteenth Day of November, 2012

David J. Kappos
*Director of the United States Patent and Trademark Office*